(12) United States Patent
Sugamura et al.

(10) Patent No.: US 8,027,570 B2
(45) Date of Patent: Sep. 27, 2011

(54) DISK UNIT-INTEGRATED DISPLAY AND DISK UNIT-INTEGRATED TELEVISION

(75) Inventors: Tomokazu Sugamura, Daito (JP); Masuo Ogawa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 1314 days.

(21) Appl. No.: 11/642,863

(22) Filed: Dec. 21, 2006

(65) Prior Publication Data

US 2007/0147796 A1 Jun. 28, 2007

(30) Foreign Application Priority Data

Dec. 22, 2005 (JP) ................................. 2005-010864

(51) Int. Cl.
*H04N 5/77* (2006.01)
(52) U.S. Cl. ......................................... 386/359; 386/358
(58) Field of Classification Search .................. None
See application file for complete search history.

(56) References Cited

U.S. PATENT DOCUMENTS

| 6,600,647 | B1 | 7/2003 | Girvin et al. | |
| 6,683,829 | B2* | 1/2004 | Inatani et al. | 369/30.85 |
| 6,897,905 | B2 | 5/2005 | Kaminosono | |
| 2005/0177840 | A1* | 8/2005 | Yim et al. | 720/603 |
| 2005/0213933 | A1* | 9/2005 | Tajima et al. | 386/46 |
| 2006/0103886 | A1 | 5/2006 | Yokawa | |
| 2006/0282724 | A1* | 12/2006 | Roulo | 714/724 |

FOREIGN PATENT DOCUMENTS

| JP | 8-56318 A | 2/1996 |
| JP | 8-249872 A | 9/1996 |
| JP | 2001-309278 A | 11/2001 |
| JP | 2002-135684 A | 5/2002 |
| JP | 2004-280917 A | 10/2004 |
| JP | 3108586 U | 2/2005 |
| JP | 2005-228465 A | 8/2005 |
| JP | 2005-278063 A | 10/2005 |
| JP | 2005-340966 A | 12/2005 |

OTHER PUBLICATIONS

European Search Report dated Nov. 6, 2007 (seven (7) pages).
Japanese Office Action dated Mar. 2, 2006 with English translation (Five (5) pages).

* cited by examiner

*Primary Examiner* — Peter-Anthony Pappas
*Assistant Examiner* — Asher Khan
(74) *Attorney, Agent, or Firm* — Crowell & Moring LLP

(57) ABSTRACT

A disk unit-integrated display capable of increase in conveyance efficiency and reduce in conveyance cost of a disk unit, a holding member and a first circuit board unitized with each other can be obtained. This disk unit-integrated display includes the disk unit having a drive portion, the holding member for supporting the disk unit, the first circuit board arranged between the disk unit and the holding member and having an opening at a position corresponding to the drive portion of the disk unit.

14 Claims, 7 Drawing Sheets

DISK UNIT-INTEGRATED DISPLAY AND DISK UNIT-INTEGRATED TELEVISION

BACKGROUND OF THE INVENTION

1. Field of the Invention

The present invention relates to a disk unit-integrated television and a disk unit-integrated display, and more particularly, it relates to a disk unit-integrated television and a disk unit-integrated display comprising a disk unit and a circuit board.

2. Description of the Background Art

A magnetic recording/reproducing device or a television comprising the magnetic recording/reproducing device is known in general, as disclosed in Japanese Patent Laying-Open Nos. 8-56318 (1996) or 8-249872 (1996), for example.

The aforementioned Japanese Patent Laying-Open No. 8-56318 (1996) discloses an electronic apparatus (television) in which a holder (holding member) with a video cassette recorder (magnetic recording/reproducing device) and a printed circuit board placed thereon is assembled along a guide rail provided in a front cabinet and thereafter the front cabinet is assembled with a rear cabinet.

The aforementioned Japanese Patent Laying-Open No. 8-249872 (1996) discloses a magnetic recording/reproducing device, in which a hole formed in a circuit board is fitted with an inwardly-protruding projection of a cabinet, whereby the circuit board is located in the cabinet, and thereafter a connector provided in the circuit board and a connector provided in a magnetic recording/reproducing portion for recording and reproducing a magnetic tape are connected to each other.

In recent years, with digitization of information, a DVD (Digital Versatile Disc) recordable digital data and the like are in widespread use as an alternative to a recording medium such as a magnetic tape recordable analog data. Therefore, various disk units capable of recording and reproducing digital data are proposed as a recording/reproducing device alternative to a magnetic recording/reproducing device, as disclosed in Japanese Patent Laying-Open Nos. 2005-228465 and 2004-280917, for example.

The aforementioned Japanese Patent Laying-Open No. 2005-228465 discloses an optical disk player (disk unit) comprising a body, a tray conveying an optical disk such as a DVD recordable digital data inside the unit, a pickup drive portion (drive portion) capable of turning upwardly and downwardly in order to load the optical disk conveyed inside the unit, a door openably/closably mounted in a portion where the tray moves into and out of the unit and inhibiting dust or the like from penetrating in the unit.

The aforementioned Japanese Patent Laying-Open No. 2004-280917 discloses a disk unit comprising a tray for conveying an optical disk such as a DVD inside the unit, and a pickup drive portion (drive portion) having a mechanism of turning upwardly and downwardly in order to load the optical disk conveyed inside the unit. In the disk unit disclosed in the Japanese Patent Laying-Open No. 2004-280917, when the optical disk conveyed inside the unit is loaded, a damper provided in the pickup drive portion is brought into contact with a lower surface of the tray, thereby inhibiting a noise from generating with rotation in loading the optical disk.

The disk unit-integrated television (DVD-integrated television) comprising the disk unit as disclosed in the aforementioned Japanese Patent Laying-Open Nos. 2005-228465 or 2004-280917 is also known. FIG. 8 is an overall perspective view of an exemplary conventional DVD-integrated television 100. FIG. 9 is a side elevational view showing the exemplary conventional DVD-integrated television 100 shown in FIG. 8, which is mounted on a holder. With reference to FIGS. 8 and 9, a structure of the exemplary conventional DVD-integrated television 100 will be described.

The exemplary conventional DVD-integrated television 100 comprises a front cabinet 101, a rear cabinet 102 and a CRT (cathode ray tube) 103 as shown in FIG. 8. The CRT 103 is so mounted on the front cabinet 101 as to expose a display surface 103a through an opening 110a of the front cabinet 101. The rear cabinet 102 is mounted on the front cabinet 101 mounted with the CRT 103. Thus, the front cabinet 101 and the rear cabinet 102 constitute an outer frame of the DVD-integrated television 100.

A holder 104, a circuit board 105 arranged on an upper side of the holder 104, a DVD drive unit 106 arranged on an upper side of the circuit board 105 are provided inside the outer frame constituted by the front cabinet 101 and the rear cabinet 102, as shown in FIG. 9. The holder 104 is integrally provided with supporting portions 104a so formed as to protrude to a side of the DVD drive unit 106 through after-mentioned holes 105a of the circuit board 105, and the DVD drive unit 106 is set in the supporting portions 104a. Accordingly, the DVD drive unit 106 set in the supporting portions 104a of the holder 104 is set at a position higher by a height of the supporting portions 104a of the holder 104 from the circuit board 105. The circuit board 105 is provided with the holes 105a at portions corresponding to the supporting portions 104a of the holder 104.

The DVD drive unit 106 includes a DVD drive unit body portion 106a, a disk tray 106b for conveying a DVD (not shown), a pickup drive portion 106c provided with a motor (not shown) serving as a driving source sliding the disk tray 106b in an anteroposterior direction, an optical pickup (not shown) for recording and reproducing data and the like. The pickup drive portion 106c is so formed as to turn downwardly in order not to hinder movement of the disk tray 106b when the disk tray 106b moves, while turning upwardly in order to receive a DVD from the disk tray 106b when the DVD is loaded. The DVD drive unit 106 is set in the supporting portions 104a of the holder 104 protruding by a position having a prescribed height from the circuit board 105. Therefore, even in a case where the pickup drive portion 106c turns downwardly when the disk tray 106b moves, the pickup drive portion 106c can be inhibited from coming contact with the circuit board 105.

In the conventional DVD-integrated television 100 shown in FIGS. 8 and 9, however, the DVD drive unit 106 must be set in the supporting portions 104a of the holder 104 in order to avoid contact of the pickup drive portion 106c turning upwardly and downwardly with the circuit board 105. Therefore, in a unitized state that the circuit board 105 and the DVD drive unit 106 are assembled to the holder 104, a height of a unit is disadvantageously increased by a height of the supporting portions 104a of the holder 104. Consequently, in a case where the unit assembled with the holder 104, the circuit board 105 and the DVD drive unit 106 are housed in a packaging box to be conveyed, the number of the units housed in the packaging box is reduced, whereby conveyance efficiency is disadvantageously decreased and conveyance cost is disadvantageously increased.

In a case where the disk unit (optical disk player) disclosed in the aforementioned Japanese Patent Laying-Open Nos. 2005-228465 or 2004-280917 is applied to the conventional DVD-integrated television 100 shown in FIGS. 8 and 9, the disk unit (optical disk player) must be also set at a position having a prescribed height from the circuit board in order to avoid contact of the drive portion (pickup drive portion) turning upwardly and downwardly to load a disk with the circuit board. Therefore, in a case where the disk unit (optical disk player) disclosed in the aforementioned Japanese Patent Laying-Open Nos. 2005-228465 or 2004-280917 is applied to the conventional DVD-integrated television 100, there is a problem similar to the case of the aforementioned conventional DVD-integrated television 100.

In the electronic apparatus (television) and the magnetic recording/reproducing device (video cassette recorder) disclosed in the aforementioned Japanese Patent Laying-Open Nos. 8-56318 (1996) and 8-249872 (1996), the pickup drive portion 106c of the DVD drive unit 106 does not turn downwardly dissimilarly to the conventional DVD-integrated television 100 shown in FIGS. 8 and 9, and therefore the magnetic recording/reproducing device is not required to be set in a position having a prescribed height from the circuit board. Thus, there does not even exist a problem to be solved by the invention that a height of the circuit board and the magnetic recording/reproducing device unitized with each other is increased.

SUMMARY OF THE INVENTION

The present invention has been proposed in order to solve the aforementioned problems, and an object of the present invention is to provide a disk unit-integrated television and a disk unit-integrated display capable of increase in conveyance efficiency and reduce in conveyance cost of a disk unit, a holding member and a first circuit board unitized with each other.

In order to attain the aforementioned object, a disk unit-integrated display according to a first aspect of the present invention comprises a disk unit having a drive portion, a holding member for supporting the disk unit, and a first circuit board arranged between the disk unit and the holding member and having an opening at a position corresponding to the drive portion of the disk unit.

In the disk unit-integrated display according to the first aspect, as hereinabove described, the opening of the first circuit board arranged between the disk unit and the holding member is provided at a position corresponding to the drive portion of the disk unit, whereby, even in a case where the drive portion of the disk unit moves downwardly in order not to hinder conveyance of a disk such as a DVD, the drive portion having moved downwardly can be inhibited from coming into contact with the first circuit board. Therefore, it is not required that the disk unit is arranged at a position having a prescribed height from the first circuit board in order not to bring the drive portion into contact with the first circuit board, whereby a height of the disk unit with respect to the first circuit board can be reduced. Thus, a height of the disk unit, the holding member and the first circuit board unitized with each other can be reduced. Consequently, when the disk unit, the holding member and the first circuit board unitized with each other are housed in a packaging box to be conveyed, the number of the units housed in the packaging box can be increased, thereby enabling increase in conveyance efficiency and reduce in conveyance cost.

In the aforementioned disk unit-integrated display according to the first aspect, the drive portion of the disk unit is preferably so formed as to be vertically movable, and at least a part of the drive portion is preferably so formed as to be located in the opening of the first circuit board in a case where the drive portion moves downwardly. According to this structure, even in a case where the drive portion of the disk unit moves downwardly in order not to hinder conveyance of a disk such as a DVD, the drive portion having moved downwardly is located in the opening of the first circuit board, whereby the drive portion can be inhibited from coming into contact with the first circuit board.

In the aforementioned disk unit-integrated display according to the first aspect, the disk unit, the holding member and the first circuit board are preferably integrally assembled to each other in a state of holding the first circuit board between the disk unit and the holding member. According to this structure, the first circuit board having a mechanical strength decreased by providing the opening can be reinforced by the disk unit and the holding member. Consequently, when the disk unit, the holding member and the first circuit board unitized with each other are conveyed, even in a case where any impact is given to the first circuit board, the first circuit board can be inhibited from being damaged.

The aforementioned disk unit-integrated display according to the first aspect preferably further comprises a second circuit board for controlling the disk unit, and a third circuit board for relaying the first circuit board and the second circuit board, wherein at least the third circuit board is preferably formed from a portion becoming unnecessary due to formation of the opening of the first circuit board, which corresponds to the opening. According to this structure, the third circuit board can be formed in the same manufacturing process as the first circuit board. Thus, the manufacturing process of the third circuit board can be simplified. Specifically, a wiring pattern necessary for relaying the first circuit board and the second circuit board is previously formed in the portion becoming unnecessary due to the formation of the opening of the first circuit board, whereby the third circuit board for relaying the first circuit board and the second circuit board can be easily formed.

The aforementioned disk unit-integrated display according to the first aspect preferably further comprises a cathode ray tube, and a fourth circuit board for controlling the cathode ray tube, wherein the fourth circuit board is preferably formed from a portion becoming unnecessary due to formation of the opening of the first circuit board, which corresponds to the opening. According to this structure, in addition to the third circuit board, the fourth circuit board can be also formed in the same manufacturing process as the first circuit board. Thus, the manufacturing process of the fourth circuit board can be simplified. Specifically, a wiring pattern necessary for controlling the cathode ray tube is previously formed in the portion becoming unnecessary due to the formation of the opening of the first circuit board, whereby the fourth circuit board for controlling the cathode ray tube can be easily formed.

In the aforementioned disk unit-integrated display comprising the second circuit board, the third circuit board is preferably so mounted on the first circuit board as to extend in a substantially perpendicular to a surface of the first circuit board, and the second circuit board is preferably set on an upper surface of the disk unit and electrically connected to the third circuit board. According to this structure, the first circuit board and the second circuit board arranged on the upper surface of the disk unit can be easily electrically connected to each other via the third circuit board formed from the portion becoming unnecessary due to formation of the opening of the first circuit board.

In this case, the second circuit board is preferably arranged substantially parallel to the first circuit board. According to this structure, the second circuit board can be inhibited from protruding in a direction away from the first circuit board (upwardly), as compared with a case where the second circuit board is arranged in a tilted state with respect to the first circuit board. Thus, it is possible to enhance a freedom degree of arrangement of an apparatus arranged above the second circuit board.

In the aforementioned structure in which the third circuit board is so mounted on the first circuit board as to extend in the substantially perpendicular to the surface of the first circuit board, the holding member preferably includes a guide portion protruding upwardly and holding a side portion of the third circuit board, the first circuit board preferably includes a first receiving hole receiving the guide portion of the holding member, and the third circuit board is preferably held by being guided with the guide portion inserted into the first receiving hole and protruding above the first circuit board. According to this structure, the third circuit board can be held by the holding member instead of the first circuit board having a mechanical strength decreased by providing the opening. Thus, the third circuit board can be more stably held.

In this case, the first circuit board preferably includes a second receiving hole receiving the third circuit board, and the first circuit board and the third circuit board are preferably soldered in a state of inserting the third circuit board into the second receiving hole so that the first circuit board and the third circuit board are electrically connected to each other. According to this structure, the first circuit board and the third circuit board can be easily electrically connected to each other.

In the aforementioned structure in which the third circuit board is so mounted on the first circuit board as to extend in the substantially perpendicular to the surface of the first circuit board, the third circuit board preferably includes a third receiving hole receiving the second circuit board in a vicinity of an upper end, and the second circuit board and the third circuit board are preferably soldered in a state of inserting the second circuit board into the third receiving hole of the third circuit board mounted on the first circuit board so that the second circuit board and the third circuit board are electrically connected to each other. According to this structure, the second circuit board and the third circuit board can be easily electrically connected to each other.

In order to attain the aforementioned object, a disk unit-integrated television according to a second aspect of the present invention comprises a cathode ray tube, a disk unit having a drive portion, a holding member for supporting the disk unit, a first circuit board arranged between the disk unit and the holding member, a second circuit board for controlling the disk unit, a third circuit board for relaying the first circuit board and the second circuit board, so mounted on the first circuit board as to extend in a substantially perpendicular to a surface of the first circuit board, and a fourth circuit board for controlling the cathode ray tube, wherein the second circuit board is set on an upper surface of the disk unit and electrically connected to the third circuit board, the first circuit board has an opening at a position corresponding to the drive portion of the disk unit, the third circuit board and the fourth circuit board are formed from a portion becoming unnecessary due to formation of the opening of the first circuit board, which corresponds to the opening, and the disk unit, the holding member and the first circuit board are integrally assembled to each other in a state of holding the first circuit board between the disk unit and the holding member.

The disk unit-integrated television according to the second aspect, as hereinabove described, the opening of the first circuit board arranged between the disk unit and the holding member is provided at a position corresponding to the drive portion of the disk unit, whereby, even in a case where the drive portion of the disk unit moves downwardly in order not to hinder conveyance of a disk such as a DVD, the drive portion having moved downwardly can be inhibited from coming into contact with the first circuit board. Therefore, it is not required that the disk unit is arranged at a position having a prescribed height from the first circuit board in order not to bring the drive portion into contact with the first circuit board, whereby a height of the disk unit with respect to the first circuit board can be reduced. Thus, a height of the disk unit, the holding member and the first circuit board unitized with each other can be reduced. Consequently, when the disk unit, the holding member and the first circuit board unitized with each other are housed in a packaging box to be conveyed, the number of the units housed in the packaging box can be increased, thereby enabling increase in conveyance efficiency and reduce in conveyance cost. The disk unit, the holding member and the first circuit board are integrally assembled to each other in a state of holding the first circuit board between the disk unit and the holding member, whereby the first circuit board having a mechanical strength decreased by providing the opening can be reinforced by the disk unit and the holding member. Consequently, when the disk unit, the holding member and the first circuit board unitized with each other are conveyed, even in a case where any impact is given to the first circuit board, the first circuit board can be inhibited from being damaged.

In the disk unit-integrated television according to the second aspect, the third circuit board and the fourth circuit board are formed from a portion becoming unnecessary due to formation of the opening of the first circuit board, which corresponds to the opening, whereby the third circuit board and the fourth circuit board can be formed in the same manufacturing process as the first circuit board. Thus, the manufacturing process of the third circuit board and the fourth circuit board can be simplified. Specifically, a wiring pattern necessary for relaying the first circuit board and the second circuit board is previously formed in the portion becoming unnecessary due to the formation of the opening of the first circuit board, whereby the third circuit board for relaying the first circuit board and the second circuit board can be easily formed. In a similar manner, a wiring pattern necessary for controlling the cathode ray tube is previously formed in the portion becoming unnecessary due to the formation of the opening of the first circuit board, whereby the fourth circuit board for controlling the cathode ray tube can be easily formed. The second circuit board for controlling the disk unit is provided on the upper surface of disk unit, and the third circuit board for relaying the first circuit board and the second circuit board is so mounted on the first circuit board as to extend in a substantially perpendicular to the surface of the first circuit board. Thus, the first circuit board and the second circuit board arranged on the upper surface of the disk unit can be easily electrically connected to each other via the third circuit board formed from the portion becoming unnecessary due to the formation of the opening of the first circuit board.

In the aforementioned disk unit-integrated television according to the second aspect, the drive portion of the disk unit is preferably so formed as to be vertically movable, and at least a part of the drive portion is preferably so formed as to be located in the opening of the first circuit board in a case where the drive portion moves downwardly. According to this structure, even in a case where the drive portion of the disk unit moves downwardly in order not to hinder conveyance of a disk such as a DVD, the drive portion having moved downwardly is located in the opening of the first circuit board and therefore can be inhibited from coming into contact with the first circuit board.

In the aforementioned disk unit-integrated television according to the second aspect, the second circuit board is preferably arranged substantially parallel to the first circuit board. According to this structure, the second circuit board can be inhibited from protruding in a direction away from the first circuit board (upwardly), as compared with a case where the second circuit board is arranged in a tilted state with respect to the first circuit board. Thus, it is possible to enhance a freedom degree of arrangement of an apparatus arranged above the second circuit board.

In the aforementioned disk unit-integrated television according to the second aspect, the holding member preferably includes a guide portion protruding upwardly and holding a side portion of the third circuit board, the first circuit board preferably includes a first receiving hole receiving the guide portion of the holding member, and the third circuit board is preferably held by being guided with the guide portion inserted into the first receiving hole and protruding above the first circuit board. According to this structure, the third circuit board can be held by the holding member instead of the first circuit board having a mechanical strength decreased by providing the opening. Thus, the third circuit board can be more stably held.

In this case, the first circuit board preferably includes a second receiving hole receiving the third circuit board, and the first circuit board and the third circuit board are preferably soldered in a state of inserting the third circuit board into the second receiving hole so that the first circuit board and the third circuit board are electrically connected to each other. According to this structure, the first circuit board and the third circuit board can be easily electrically connected to each other.

In the aforementioned disk unit-integrated television according to the second aspect, the third circuit board preferably includes a third receiving hole receiving the second circuit board in a vicinity of an upper end, and the second circuit board and the third circuit board are preferably soldered in a state of inserting the second circuit board into the third receiving hole of the third circuit board mounted on the first circuit board so that the second circuit board and the third circuit board are electrically connected to each other. According to this structure, the second circuit board and the third circuit board can be easily electrically connected to each other.

DESCRIPTION OF THE PREFERRED EMBODIMENTS

An embodiment of the present invention will be hereinafter described with reference to the drawings.

A structure of a DVD-integrated television 1 according to the embodiment of the present invention will be described with reference to FIGS. 1 to 7. The embodiment of the present invention is applied to the DVD-integrated television, which is an exemplary disk unit-integrated display and an exemplary disk unit-integrated television.

Figure 1:
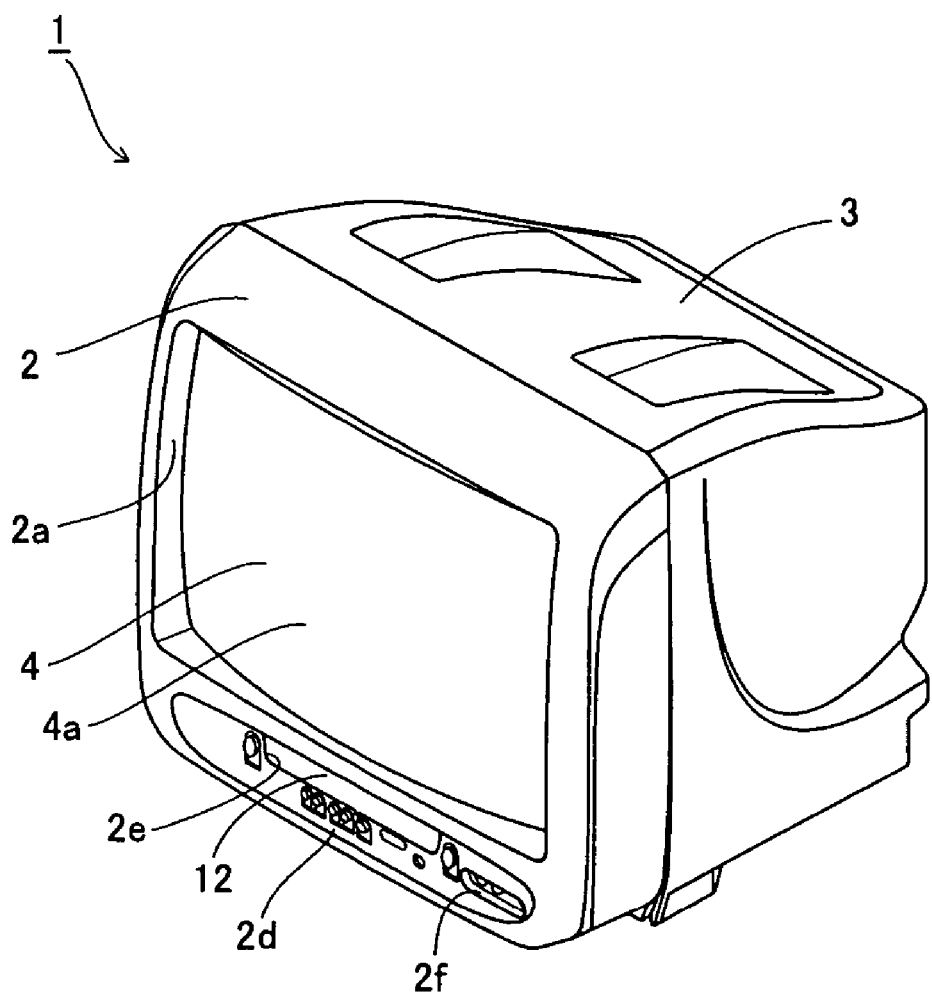
FIG. 1 is a perspective view showing an overall structure of a DVD-integrated television according to an embodiment of the present invention.
Figure 2:
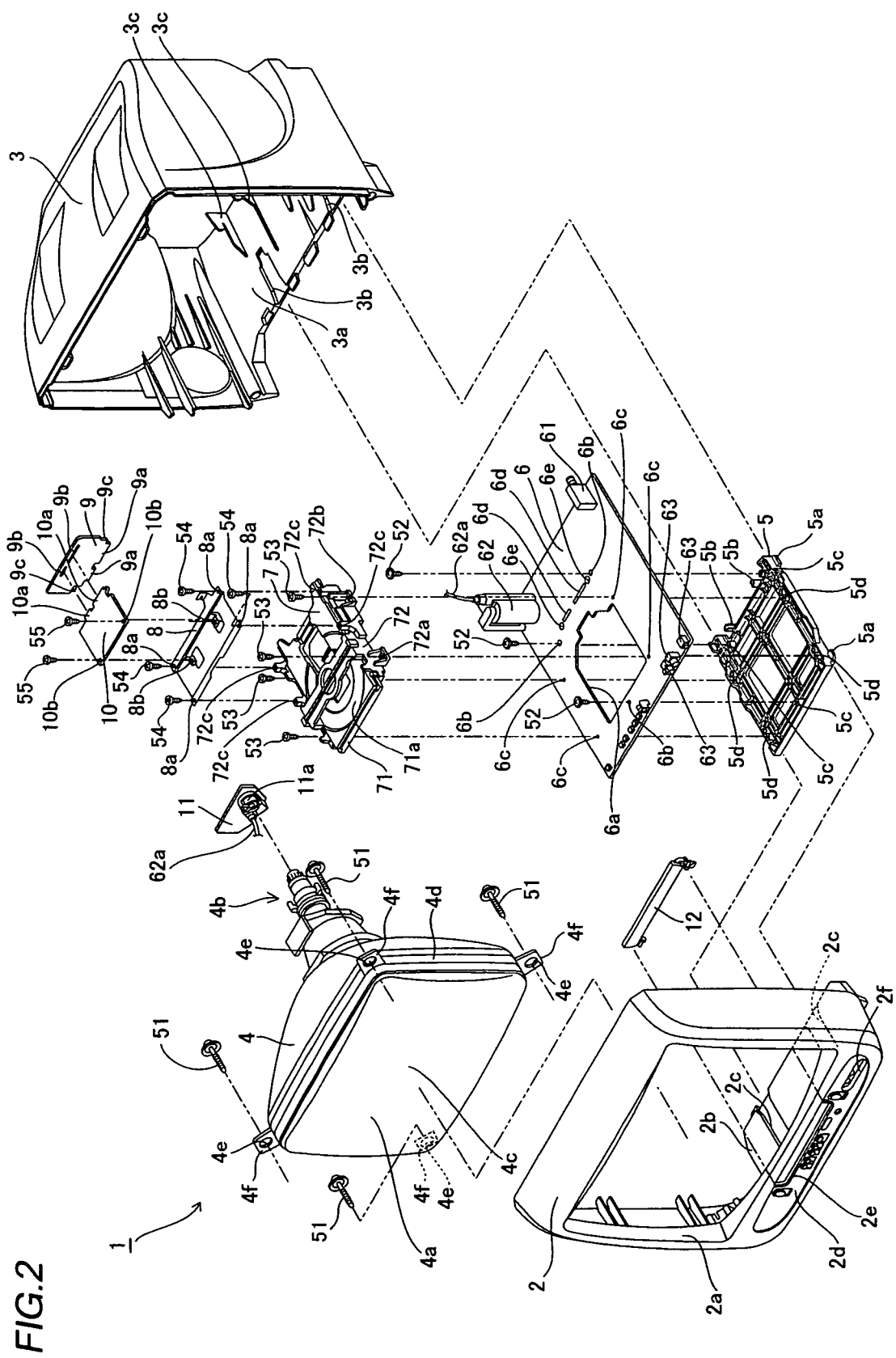
FIG. 2 is an exploded perspective view of the DVD-integrated television according to the embodiment shown in FIG. 1.

As shown in FIGS. 1 and 2, the DVD-integrated television 1 according to the embodiment of the present invention comprises a front cabinet 2 and a rear cabinet 3 constituting an outer frame of the DVD-integrated television 1, a CRT (cathode ray tube) 4 mounted on the front cabinet 2, a holder 5 made of resin, a main circuit board 6 for controlling a television, a DVD drive unit 7 for driving a DVD (not shown), a shield member 8 made of metal, a relay board 9, a DVD circuit board 10 for controlling the DVD drive unit 7, a CRT circuit board 11 for controlling the CRT 4, and a door member 12. The main circuit board 6, the relay board 9, the DVD circuit board 10 and the CRT circuit board 11 are examples of the "first circuit board", the "third circuit board", the "second circuit board" and the "fourth circuit board" in the present invention respectively.

Figure 4:
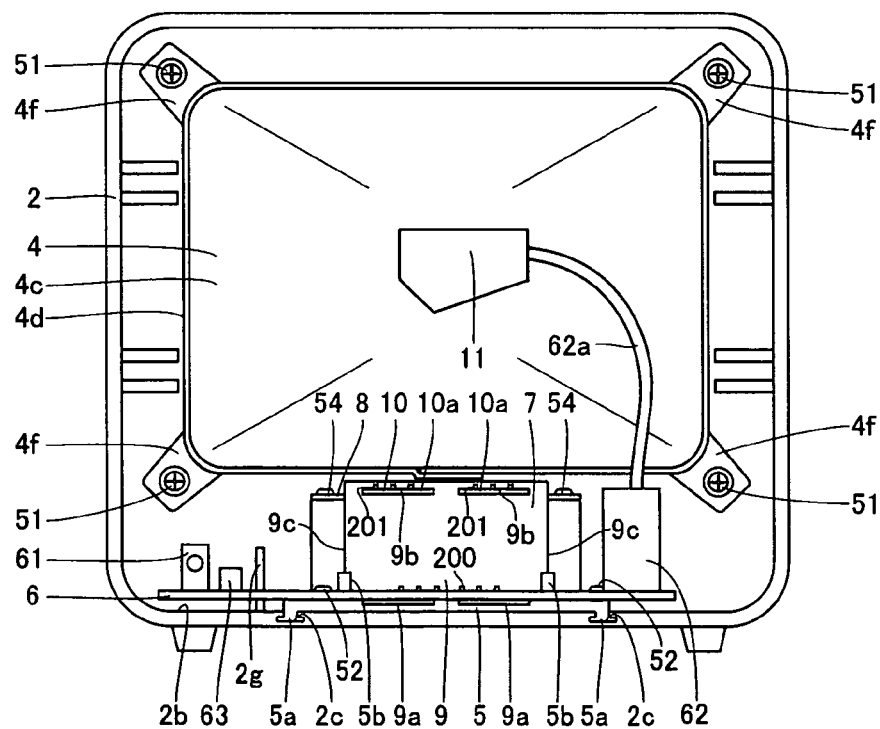
FIG. 4 is a front view showing the DVD-integrated television from which a rear cabinet is removed according to the embodiment shown in FIG. 1.

As shown in FIGS. 1 and 2, the front cabinet 2 is provided with a display window 2a exposing a display region 4a of the CRT 4, a bottom surface 2b, a pair of rail portions 2c formed on the bottom surface 2b, an operating portion 2d in which various manual operation buttons such as a power supply are arranged, an opening 2e for projecting an after-mentioned disk tray 71 of the DVD drive unit 7 outside the front cabinet 2, terminal receiving holes 2f receiving after-mentioned jacks (AV terminals) 63 of the main circuit board 6, holding rib portions 2g for holding the main circuit board 6 (see FIG. 4). The opening 2e is mounted with a door member 12 that opens and closes in conjunction with projecting and housing of the disk tray 71 of the DVD drive unit 7.

The rear cabinet 3 is provided with a bottom surface 3a, a pair of rail portions 3b formed on the bottom surface 3a, holding rib portions 3c for holding the main circuit board 6, as shown in FIG. 2. The rear cabinet 3 is mounted on the front cabinet 2 by tightening screws (not shown) with respect to the front cabinet 2.

The CRT 4 is mounted on the front cabinet 2 while the display region 4a is exposed from the display window 2a of the front cabinet 2, as shown in FIGS. 1, 2 and 4. The CRT 4 includes the display region 4a, an electron gun 4b emitting an electron beam, and a glass tube 4c forming a vacuum region, and an explosion-proof band 4d made of iron wound around the glass tube 4c, as shown in FIG. 2. The explosion-proof band 4d of the CRT 4 is formed in a belt-shape and is wound around the glass tube 4c at a prescribed position, and thus has a function of preventing implosion of the glass tube 4c in a vacuum state. Four corners of the explosion-proof band 4d wound around the glass tube 4c are integrally formed with screw mounting portions 4f formed with screw receiving holes 4e for mounting the CRT 4 on the front cabinet 2 respectively. Screws 51 are fitted in the front cabinet 2 through the screw receiving holes 4e of the screw mounting portions 4f respectively, whereby the CRT 4 is mounted on the front cabinet 2. The CRT 4 is an example of the "cathode ray tube" in the present invention.

Figure 5:
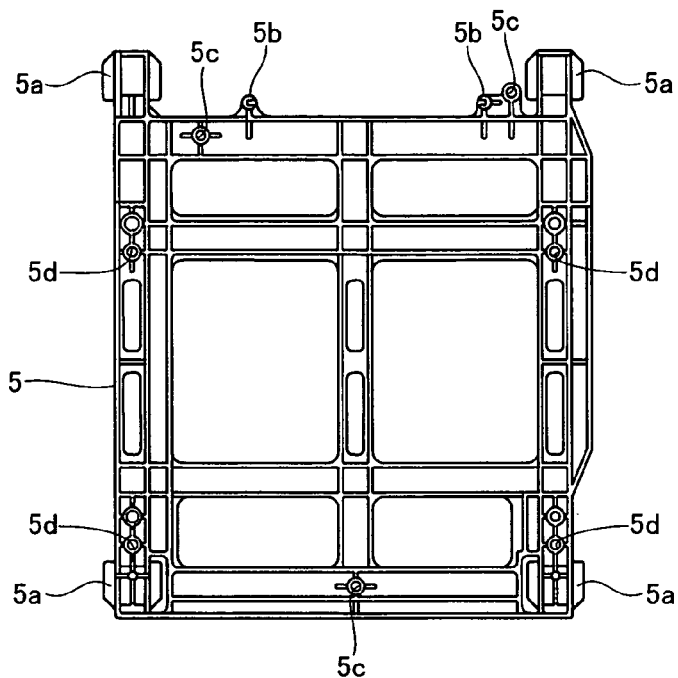
FIG. 5 is a plan view of the holder of the DVD-integrated television according to the embodiment shown in FIG. 1.

As shown in FIGS. 2 and 5, the holder 5 made of resin includes four rail engaging portions 5a engaged with the pair of rail portions 2c of the front cabinet 2 and the pair of rail portions 3b of the rear cabinet 3, guide portions 5b protruding upwardly and guiding the relay board 9 in a vertical direction, screw mounting holes 5c for mounting the main circuit board 6, and screw mounting holes 5d for mounting the DVD drive unit 7. The rail engaging portions 5a of the holder 5 are engaged with the rail portions 2c of the front cabinet 2 and the rail portions 3b of the rear cabinet 3 when the front cabinet 2 and the rear cabinet 3 are assembled, whereby the holder 5 is so formed as to be mounted on the front cabinet 2 and the rear cabinet 3. The main circuit board 6 is so formed as to be held by the holding rib portions 2g of the front cabinet 2 and the holding rib portions 3c of the rear cabinet 3 when the rear cabinet 3 is mounted on the front cabinet 2. The holder 5 is an example of the "holding member" in the present invention.

Figure 6:
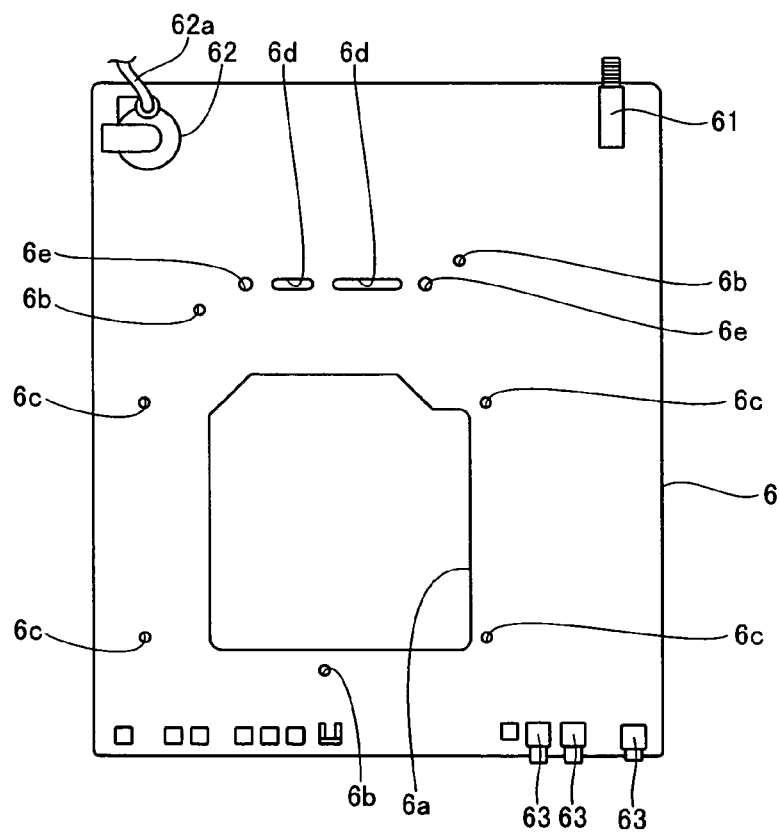
FIG. 6 is a plan view of a circuit board of the DVD-integrated television according to the embodiment shown in FIG. 1.

As shown in FIGS. 2 and 6, the main circuit board 6 for controlling the television includes an opening 6a, screw receiving holes 6b for mounting the main circuit board 6 on the holder 5, screw receiving holes 6c for mounting the DVD drive unit 7 on the holder 5, terminal connection holes 6d each receiving an after-mentioned terminal portion 9a of the relay board 9, guide portion receiving holes 6e each receiving the guide portion 5b of the holder 5. As shown in FIG. 4, in a state that the main circuit board 6 is mounted on the holder 5, the upwardly-protruding guide portions 5b of the holder 5 upwardly protrude from the guide portion receiving holes 6e respectively. The main circuit board 6 is mounted with an antenna receiving portion 61 receiving an antenna wire, a fly back transformer 62 supplying a high voltage to the CRT 4, and a plurality of the jacks (AV terminals) 63 used when connecting to other equipment. Screws 52 are fitted in the screw mounting holes 5c of the holder 5 through the screw receiving holes 6b respectively, whereby the main circuit board 6 is mounted on the holder 5. The guide portion receiving holes 6e and the terminal connection holes 6d are examples of "first receiving hole" and "second receiving hole" in the present invention respectively.

According to this embodiment, the opening 6a of the main circuit board 6 is provided at a position corresponding to an after-mentioned pickup drive portion 73 of the DVD drive unit 7. Therefore, in a case where the pickup drive portion 73 of the DVD drive unit 7 turns downwardly (along arrow A in FIG. 7), the pickup drive portion 73 is located in the opening 6a, thereby capable of inhibiting the pickup drive portion 73 from coming contact with the main circuit board 6. The main circuit board 6 is formed by cutting off a prescribed portion (a portion corresponding to the opening 6a) from a rectangular circuit board, and the after-mentioned relay board 9 and the CRT circuit board 11 are formed from the portion that has cut off.

Figure 3:
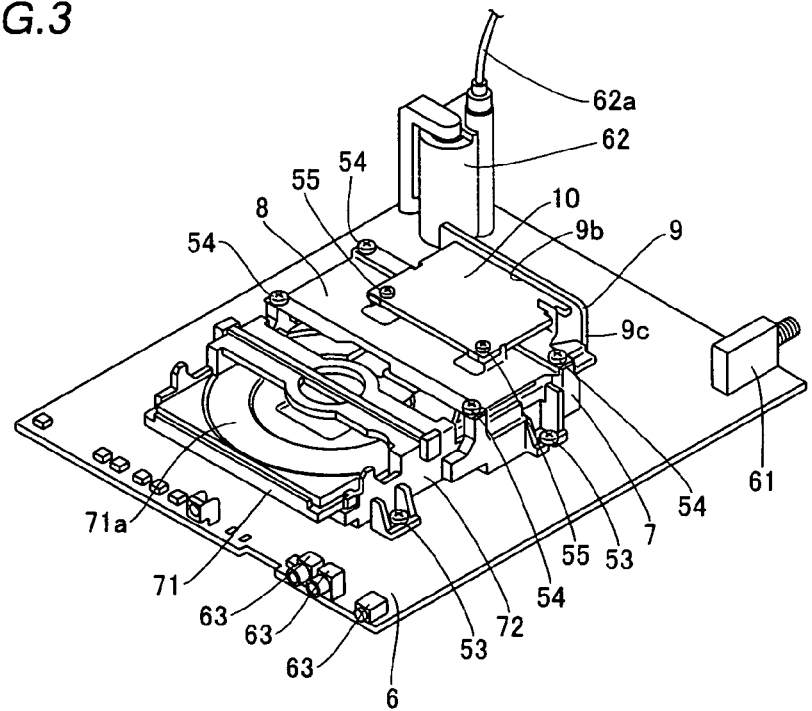
FIG. 3 is a perspective view showing a DVD drive unit of the DVD-integrated television which is mounted on a holder according to the embodiment shown in FIG. 1.
Figure 7:
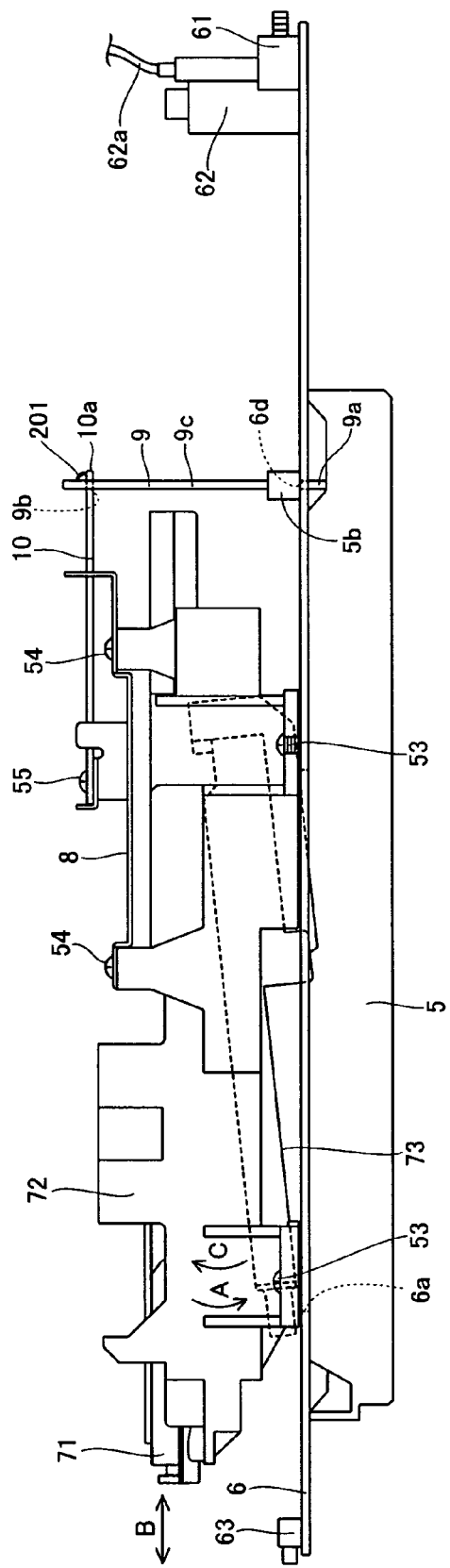
FIG. 7 is a side elevational view showing the DVD drive unit of the DVD-integrated television which is mounted on the holder according to the embodiment shown in FIG. 1.
Figure 8:
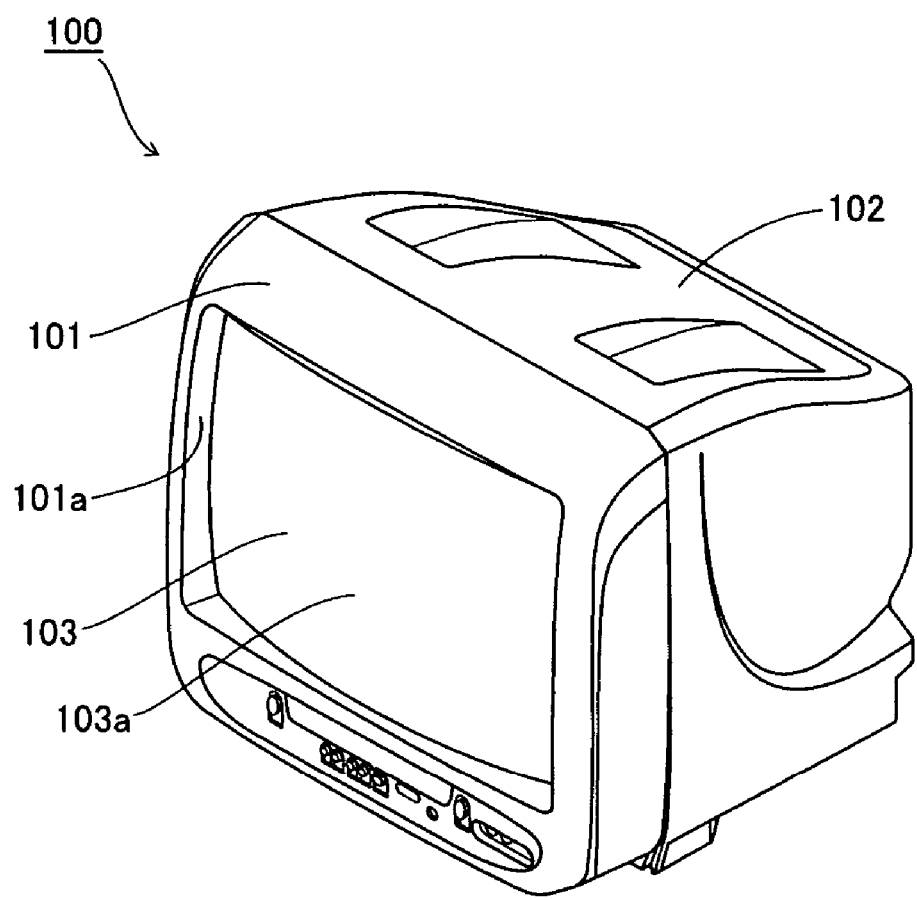
FIG. 8 is an overall perspective view of an exemplary conventional DVD-integrated television.
Figure 9:
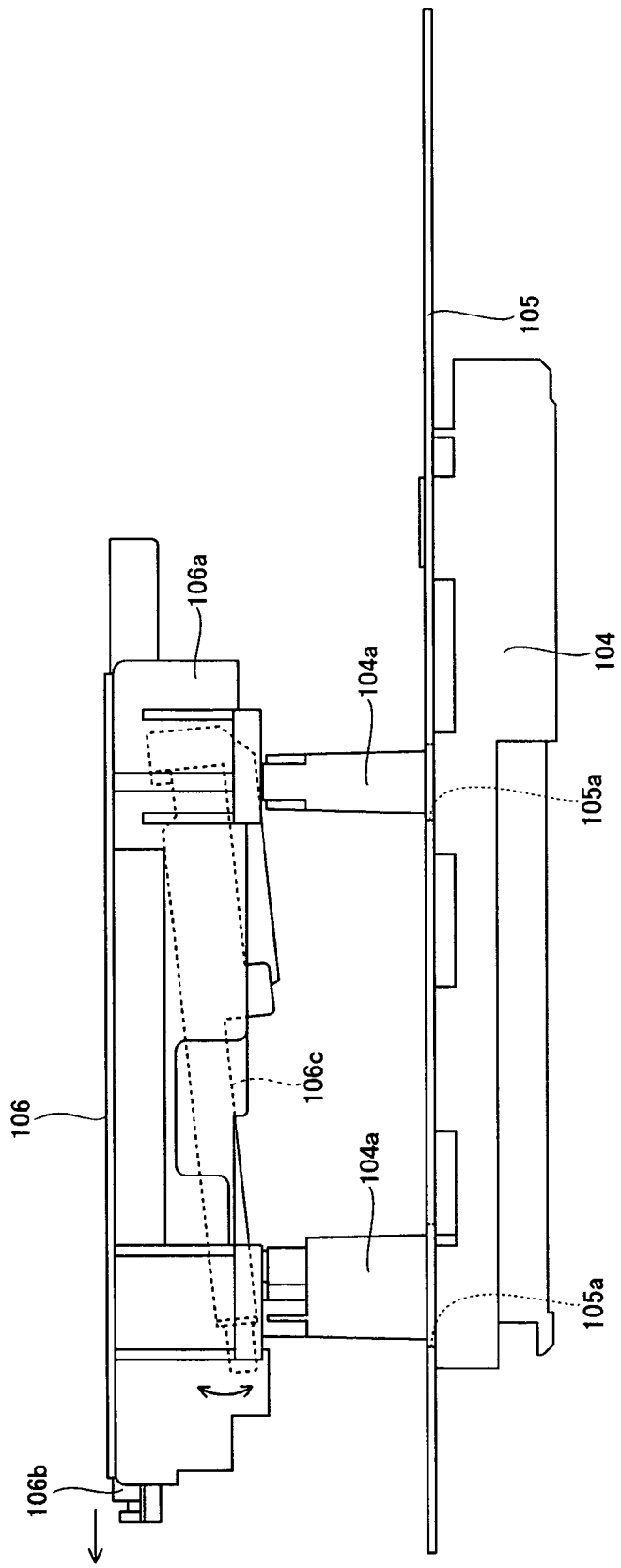
FIG. 9 is an elevational view showing the DVD drive unit of the exemplary conventional DVD-integrated television shown in FIG. 8 which is mounted on the holder.

As shown in FIGS. 2, 3, and 7, the DVD drive unit 7 includes the disk tray 71 for conveying a DVD (not shown), a DVD drive unit body portion 72 mounted with the disk tray 71 slidably in an anteroposterior direction (along arrow B in FIG. 7), the pickup drive portion 73 provided with a motor (not shown) serving as a driving source sliding the disk tray 71 in an anteroposterior direction, an optical pickup (not shown) for recording and reproducing data and the like. The pickup drive portion 73 is so formed as to be capable of turning vertically (along arrows A and C in FIG. 7) in conjunction with anteroposterior movement of the disk tray 71.

The disk tray 71 slides in the anteroposterior direction, whereby the disk tray 71 is so formed as to be projected outside the front cabinet 2 through the opening 2e of the front cabinet 2 and be housed inside the front cabinet 2. Thus, it is possible to convey, inside the DVD-integrated television 1, a DVD (not shown) set in a disk setting portion 71a of the disk tray 71 projected outside through the opening 2e of the front cabinet 2.

The DVD drive unit body portion 72 is formed with screw receiving holes 72a and screw receiving cutouts 72b for mounting the DVD drive unit 7 on the holder 5, and screw mounting holes 72c for mounting the after-mentioned shield member 8. Therefore, according to this embodiment, each of screws 53 is fastened to the screw mounting hole 5d of the holder 5 through the screw receiving hole 72a or the screw receiving cutout 72b and the screw receiving hole 6c of the main circuit board 6, whereby holder 5, the main circuit board 6 and the DVD drive unit 7 are integrally assembled to each other in a state of holding the main circuit board 6 between the holder 5 and the DVD drive unit 7. The DVD drive unit 7 is an example of the "disk unit" in the present invention.

As shown in FIG. 7, the pickup drive portion 73 is so formed as to turn downwardly (along arrow A in FIG. 7) in order not to hinder movement of the disk tray 71 when the disk tray 71 moves, while turning upwardly (along arrow C in FIG. 7) in order to record and reproduce data of a DVD conveyed by the disk tray 71 when the DVD is loaded.

The shield member 8 includes screw receiving holes 8a for mounting the shield member 8 on the DVD drive unit 7, screw mounting holes 8b for mounting the DVD circuit board 10 on the shield member 8 as shown in FIGS. 2 and 3. Screws 54 are fastened to the screw mounting holes 72c of the DVD drive unit 7 through the screw receiving holes 8a respectively, whereby the shield member 8 is mounted on the DVD drive unit body portion 72 of the DVD drive unit 7.

The relay board 9 is provided for electrically relaying the main circuit board 6 and the DVD circuit board 10 as shown in FIGS. 2 to 4. The relay board 9 includes the terminal portions 9a and terminal connection holes 9b each receiving a terminal portion 10a of the DVD circuit board 10 as shown in FIG. 2. The terminal portions 9a of the relay board 9 are soldered by solders 200 (see FIG. 4) in a state of being inserted into the terminal connection holes 6d of the main circuit board 6 respectively, whereby the relay board 9 and the main circuit board 6 are electrically connected to each other. Lower ends of both side ends 9c (see FIG. 2) in a longitudinal direction of the relay board 9 are inserted into the guide portions 5b of the holder 5 protruding upwardly from the guide portion receiving holes 6e of the main circuit board 6 respectively, whereby the relay board 9 is held by the guide portions 5b and is so mounted on the main circuit board 6 as to extend in a vertical direction from a surface of the main circuit board 6. The terminal connection holes 9b and the side ends 9c are examples of the "third receiving hole" and the "side portion" in the present invention respectively.

According to this embodiment, the DVD circuit board 10 for controlling the DVD drive unit 7 is so mounted on an upper surface of the DVD drive unit 7 with the shield member 8 therebetween as to be arranged substantially parallel to the main circuit board 6, as shown in FIGS. 2 to 4. The DVD circuit board 10 includes the terminal portions 10a, screw receiving holes 10b for mounting the DVD circuit board 10 on the shield member 8. The terminal portions 10a of the DVD circuit board 10 are soldered by solders 201 (see FIG. 4) in a state of being inserted into the terminal connection holes 9b of the relay board 9 respectively, whereby the DVD circuit board 10 and the relay board 9 are electrically connected to each other. Screws 55 are fastened to the screw mounting holes 8b of the shield member 8 through the screw receiving holes 10b respectively, whereby the DVD circuit board 10 is mounted on the shield member 8.

The CRT circuit board 11 for controlling the CRT 4 is provided with a socket 11a connected to the electron gun 4b of the CRT as shown in FIGS. 2 and 4. The CRT circuit board 11 is connected by a cable 62a extending from the fly back transformer 62 mounted on the main circuit board 6.

In procedure for mounting the relay board 9 and the DVD circuit board 10 of the DVD-integrated television 1 according to this embodiment, first, the holder 5, the main circuit board 6, the DVD drive unit 7 and the shield member 8 are assembled. Thereafter, the lower ends of the both side ends 9c of the relay board 9 are inserted into the guide portions 5b of the holder 5 respectively and the terminal portions 9a are inserted into the terminal connection holes 6d, whereby the relay board 9 is mounted on the main circuit board 6. Thereafter, the screws 55 are fastened from above to the screw mounting holes 8b of the shield member 8 through the screw receiving holes 10b respectively, in a state that the terminal portions 10a of the DVD circuit board 10 are inserted into the terminal connection holes 9b of the relay board 9 respectively, whereby the DVD circuit board 10 is mounted on the shield member 8. Thus, the relay board 9 and the DVD circuit board 10 are mounted. Thereafter, the main circuit board 6 and the relay board 9 are electrically connected to each other by the solders 200, and the DVD circuit board 10 and the relay board 9 are electrically connected to each other by the solders 201.

According to this embodiment, as hereinabove described, the opening 6a of the main circuit board 6 arranged between the DVD drive unit 7 and the holder 5 is provided at a position corresponding to the pickup drive portion 73 of the DVD drive unit 7, whereby, even in a case where the pickup drive portion 73 of the DVD drive unit 7 turns downwardly (along arrow A in FIG. 7) in order not to hinder movement of the disk tray 71 conveying a DVD, the pickup drive portion 73 having turned downwardly can be inhibited from coming contact with the main circuit board 6. Therefore, it is not required that the DVD drive unit 7 is arranged at a position having a prescribed height from the main circuit board 6 in order not to bring the pickup drive portion 73 into contact with the main circuit board 6, whereby a height of the DVD drive unit 7 with respect to the main circuit board 6 can be reduced. Thus, a height of the DVD drive unit 7, the holder 5 and the main circuit board 6 unitized with each other can be reduced. Consequently, when the DVD drive unit 7, the holder 5 and the main circuit board 6 unitized with each other are housed in a packaging box to be conveyed, the number of the units housed in the packaging box can be increased, thereby enabling increase in conveyance efficiency and reduce in conveyance cost.

According to this embodiment, the DVD drive unit 7, the holder 5 and the main circuit board 6 are integrally assembled to each other in a state of holding the main circuit board 6 between the DVD drive unit 7 and the holder 5, whereby the main circuit board 6 having a mechanical strength decreased by providing the opening 6a can be reinforced by the DVD drive unit 7 and the holder 5. Consequently, when the DVD drive unit 7, the holder 5 and the main circuit board 6 unitized with each other are conveyed, even in a case where any impact is given to the main circuit board 6, the main circuit board 6 can be inhibited from being damaged.

According to this embodiment, the relay board 9 and the CRT circuit board 11 are formed from a portion becoming unnecessary due to formation of the opening 6a of the main circuit board 6, whereby the relay board 9 and the CRT circuit board 11 can be formed in the same manufacturing process as the main circuit board 6. Thus, the manufacturing process of the relay board 9 and the CRT circuit board 11 can be simplified. Specifically, a wiring pattern necessary for relaying the main circuit board 6 and the DVD circuit board 10 is previously formed in the portion becoming unnecessary due to the formation of the opening 6a of the main circuit board 6, whereby the relay board 9 for relaying the main circuit board 6 and the DVD circuit board 10 can be easily formed. In a similar manner, a wiring pattern necessary for controlling the CRT 4 is previously formed in the portion becoming unnecessary due to the formation of the opening 6a of the main circuit board 6, whereby the CRT circuit board 11 for controlling the CRT 4 can be easily formed.

According to this embodiment, in a case where the pickup drive portion 73 moves downwardly, the pickup drive portion 73 is so formed as to be partially located in the opening 6a of the main circuit board 6, whereby, in a case where the pickup drive portion 73 of the DVD drive unit 7 moves downwardly in order not to hinder conveyance of a disk such as a DVD, the pickup drive portion 73 having moved downwardly is located in the opening 6a of the main circuit board 6. Thus, the pickup drive portion 73 can be inhibited from coming contact with the main circuit board 6.

According to this embodiment, the DVD circuit board 10 is arranged substantially parallel to the main circuit board 6, whereby the DVD circuit board 10 can be inhibited from protruding in a direction away from the main circuit board 6 (upwardly), as compared with a case where the DVD circuit board 10 is arranged in a tilted state with respect to the main circuit board 6. Thus, it is possible to enhance a freedom degree of arrangement of the CRT 4 arranged above the DVD circuit board 10.

According to this embodiment, the relay board 9 is guided and held by the guide portions 5b inserted into the guide portion receiving holes 6e and protruding upwardly above the main circuit board 6, whereby the relay board 9 can be held by the holder 5 instead of the main circuit board 6 having a mechanical strength decreased by providing the opening 6a.

According to this embodiment, the main circuit board 6 and the relay board 9 are soldered by the solders 200 in a state of inserting the terminal portions 9a of the relay board 9 into the terminal connection holes 6d respectively, whereby the main circuit board 6 and the relay board 9 are electrically connected to each other. Thus, the main circuit board 6 and the relay board 9 can be easily electrically connected to each other.

According to this embodiment, the DVD circuit board 10 and the relay board 9 are soldered by the solders 201 in a state of inserting the terminal portions 10a of the DVD circuit board 10 into the terminal connection holes 9b of the relay board 9 mounted on the main circuit board 6 respectively, the DVD circuit board 10 and the relay board 9 are electrically connected to each other. Thus, the DVD circuit board 10 and the relay board 9 can be easily electrically connected to each other.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment of the present invention is applied to the DVD-integrated television comprising the DVD drive unit as an exemplary disk unit-integrated display according to the present invention, the present invention is not restricted to this but is also applicable to other display comprising a disk unit.

While the relay board 9 and the CRT circuit board 11 are formed from the portion that becomes unnecessary when the opening 6a of the main circuit board 6 is formed in the aforementioned embodiment, the present invention is not restricted to this but the relay board 9 and the CRT circuit board 11 may be alternatively formed from a usual circuit board instead of the portion becoming unnecessary due to the formation of the opening 6a of the main circuit board 6, which corresponds to the opening.

What is claimed is:

1. A disk unit-integrated display comprising:
a disk unit having a drive portion;
a holding member for supporting said disk unit;
a first circuit board arranged between said disk unit and said holding member and having an opening at a position corresponding to said drive portion of said disk unit; wherein
said drive portion of said disk unit is so formed as to be vertically movable, and at least a part of said drive portion is so formed as to be located in said opening of said first circuit board in a case where said drive portion moves downwardly; and
said part of said drive portion which is located in said opening is a projection portion which projects downward.

2. The disk unit-integrated display according to claim 1, wherein
said disk unit, said holding member and said first circuit board are integrally assembled to each other in a state of holding said first circuit board between said disk unit and said holding member.

3. The disk unit-integrated display according to claim 1, further comprising:
a second circuit board for controlling said disk unit; and
a third circuit board for relaying said first circuit board and said second circuit board, wherein
at least said third circuit board is formed from a portion becoming unnecessary due to formation of said opening of said first circuit board, which corresponds to said opening.

4. The disk unit-integrated display according to claim 3, wherein
said third circuit board is so mounted on said first circuit board as to extend perpendicular to a surface of said first circuit board, and
said second circuit board is set on an upper surface of said disk unit and electrically connected to said third circuit board.

5. The disk unit-integrated display according to claim 4, wherein
said second circuit board is arranged parallel to said first circuit board.

6. The disk unit-integrated display according to claim 4, wherein
said holding member includes a guide portion protruding upwardly and holding a side portion of said third circuit board,
said first circuit board includes a first receiving hole receiving said guide portion of said holding member, and
said third circuit board is held by being guided with said guide portion inserted into said first receiving hole and protruding above said first circuit board.

7. The disk unit-integrated display according to claim 6, wherein
said first circuit board includes a second receiving hole receiving said third circuit board, and
said first circuit board and said third circuit board are soldered in a state of inserting said third circuit board into said second receiving hole so that said first circuit board and said third circuit board are electrically connected to each other.

8. The disk unit-integrated display according to claim 4, wherein
said third circuit board includes a third receiving hole receiving said second circuit board in a vicinity of an upper end, and
said second circuit board and said third circuit board are soldered in a state of inserting said second circuit board into said third receiving hole of said third circuit board mounted on said first circuit board so that said second circuit board and said third circuit board are electrically connected to each other.

9. The disk unit-integrated display according to claim 1, further comprising:
a cathode ray tube; and
a fourth circuit board for controlling said cathode ray tube, wherein
said fourth circuit board is formed from a portion becoming unnecessary due to formation of said opening of said first circuit board, which corresponds to said opening.

10. A disk unit-integrated television comprising:
a cathode ray tube;
a disk unit having a drive portion;
a holding member for supporting said disk unit;
a first circuit board arranged between said disk unit and said holding member;
a second circuit board for controlling said disk unit;
a third circuit board for relaying said first circuit board and said second circuit board, so mounted on said first circuit board as to extend perpendicular to a surface of said first circuit board; and
a fourth circuit board for controlling said cathode ray tube, wherein
said second circuit board is set on an upper surface of said disk unit and electrically connected to said third circuit board,
said first circuit board has an opening at a position corresponding to said drive portion of said disk unit,
said third circuit board and said fourth circuit board are formed from a portion becoming unnecessary due to formation of said opening of said first circuit board, which corresponds to said opening, and
said disk unit, said holding member and said first circuit board are integrally assembled to each other in a state of holding said first circuit board between said disk unit and said holding member;
said drive portion of said disk unit is so formed as to be vertically movable, and at least a part of said drive portion is so formed as to be located in said opening of said first circuit board in a case where said drive portion moves downwardly; and
said part of said drive portion which is located in said opening is a projection portion which projects downward.

11. The disk unit-integrated television according to claim 10, wherein
said second circuit board is arranged parallel to said first circuit board.

12. The disk unit-integrated television according to claim 10, wherein
said holding member includes a guide portion protruding upwardly and holding a side portion of said third circuit board, said first circuit board includes a first receiving hole receiving said guide portion of said holding member, and said third circuit board is held by being guided with said guide portion inserted into said first receiving hole and protruding above said first circuit board.

13. The disk unit-integrated television according to claim 12, wherein said first circuit board includes a second receiving hole receiving said third circuit board, and said first circuit board and said third circuit board are soldered in a state of inserting said third circuit board into said second receiving hole so that said first circuit board and said third circuit board are electrically connected to each other.

14. The disk unit-integrated television according to claim 10, wherein said third circuit board includes a third receiving hole receiving said second circuit board in a vicinity of an upper end, and said second circuit board and said third circuit board are soldered in a state of inserting said second circuit board into said third receiving hole of said third circuit board mounted on said first circuit board so that said second circuit board and said third circuit board are electrically connected to each other.

* * * * *